United States Patent

Crenshaw et al.

[11] Patent Number: 5,998,225
[45] Date of Patent: Dec. 7, 1999

[54] METHOD OF FABRICATING AN OXYGEN-STABLE LAYER/DIFFUSION BARRIER/POLY BOTTOM ELECTRODE STRUCTURE FOR HIGH-K DRAMS USING DISPOSABLE-OXIDE PROCESSING

[75] Inventors: Darius Crenshaw, Allen, Tex.; Scott Summerfelt, Cupertino, Calif.

[73] Assignee: Texas Instruments Incorporated, Dallas, Tex.

[21] Appl. No.: 09/212,041

[22] Filed: Dec. 15, 1998

Related U.S. Application Data

[60] Provisional application No. 60/069,937, Dec. 17, 1997.

[51] Int. Cl.[6] .................................................. H01G 7/06
[52] U.S. Cl. ............................................. 438/3; 438/240
[58] Field of Search ............................... 438/3, 238–241, 438/250–256, 381, 394–399

[56] References Cited

U.S. PATENT DOCUMENTS

| | | | |
|---|---|---|---|
| 5,393,352 | 2/1995 | Summerfelt | 148/33.3 |
| 5,471,364 | 11/1995 | Summerfelt et al. | 361/321.4 |
| 5,554,564 | 9/1996 | Nishioka et al. | 437/192 |
| 5,566,045 | 10/1996 | Summerfelt et al. | 361/231.1 |
| 5,585,300 | 12/1996 | Summerfelt | 437/60 |
| 5,589,284 | 12/1996 | Summerfelt et al. | 428/697 |
| 5,907,762 | 5/1999 | Evans et al. | 438/3 |
| 5,909,624 | 6/1999 | Yeager | 438/3 |

*Primary Examiner*—Jey Tsai
*Attorney, Agent, or Firm*—Jacqueline J. Garner; Wade James Brady; Richard L. Donaldson

[57] ABSTRACT

A capacitor structure and method. The capacitor (12) comprises a HDC dielectric (40) and upper (44) and lower electrodes. The lower electrode comprises polysilicon (31–32), a diffusion barrier (34) on the polysilicon and an oxygen stable material (36) on the diffusion barrier (34). The diffusion barrier (34) is deposited followed by the deposition of a temporary dielectric layer (50). The temporary dielectric layer (50) is then patterned and etched to expose the area where the storage node is desired. Next, the oxygen stable material (36) is deposited. The oxygen stable material (36) is then either etched back or CMP processed using the temporary dielectric layer (50) as an endpoint. The temporary dielectric layer (50) is then removed along with the exposed portions of diffusion barrier (34). The HDC dielectric (40) is then formed adjacent the oxygen stable material (36).

17 Claims, 4 Drawing Sheets

METHOD OF FABRICATING AN OXYGEN-STABLE LAYER/DIFFUSION BARRIER/POLY BOTTOM ELECTRODE STRUCTURE FOR HIGH-K DRAMS USING DISPOSABLE-OXIDE PROCESSING

CROSS-REFERENCE TO RELATED CO-PENDING APPLICATIONS

This application claims priority under 35 USC § 119 (e) (1) of provisional application number 60/069,937, filed Dec. 17, 1997.

The following co-assigned patent applications are related and are hereby incorporated by reference:

Serial No. Filing date Inventor(s)
09/211,668 Dec. 15, 1998 Crenshaw et al.
09/212,031 Dec. 15, 1998 Crenshaw et al.
09/211,911 Dec. 15, 1998 Crenshaw et al.

FIELD OF THE INVENTION

This invention generally relates to the fabrication of high dielectric constant capacitors.

BACKGROUND OF THE INVENTION

The increasing density of integrated circuits (e.g., DRAMs) is increasing the need for materials with high dielectric constants to be used in electrical devices such as capacitors. Generally, capacitance is directly related to the surface area of the electrode in contact with the capacitor dielectric, but it is not significantly affected by the electrode volume. The current method generally used to achieve higher capacitance per unit area is to increase the surface area/unit area by increasing the topography in trench and stack capacitors using silicon dioxide or silicon dioxide/silicon nitride as the dielectric. This approach becomes very difficult in terms of manufacturability for devices such as the 256 Mbit and 1 Gbit DRAMs.

An alternative approach is to use a high permitivity dielectric material. Many high dielectric constant (HDC) materials including perovskites, ferroelectrics and others, such as (Ba, Sr)TiO3 (BST), usually have much larger capacitance densities than standard SiO2-Si3N4-SiO2 capacitors. The deposition process for HDC materials such as BST usually occurs at high temperature (generally greater than 500° C.) in an oxygen containing atmosphere. Therefore, the lower electrode structure formed prior to the HDC deposition should be stable in an oxygen atmosphere and at these temperatures.

Various metals and metallic compounds, and typically noble metals such as Pt and conductive oxides such as RuO2, have been proposed as the electrodes for the HDC materials. However, there are several problems with the materials thus far chosen for the lower electrode in thin-film applications. Many of these problems are related to semiconductor process integration. For example, it has been found to be difficult to use Pt alone as the lower electrode. While Pt is stable in oxygen, it generally allows oxygen to diffuse through it allowing neighboring materials to oxidize. Pt does not normally stick very well to traditional dielectrics such as silicon dioxide and silicon nitride and Pt can rapidly form a silicide at low temperatures. Therefore, prior art methods have used lower electrodes comprising multiple layers to separate the Pt from the underlying silicon. However, even when multiple layers are used for the lower electrode, a problem remains in that Pt is very difficult to etch when using a pattern. The principle problem is the difficulty in forming volatile halides. For example, etching Pt in fluorine and chlorine gas mixtures is almost a completely physical process until very high temperatures (>300° C.) are reached. Physical etching typically results in redeposition on the sidewalls of photoresist or other pattern definers unless a very sloped sidewall (<65 degrees) is used. If the goal is to etch 1G-like structures (F-0.18 $\mu$m) with reasonable aspect ratios (>1), then sloped sidewalls are a serious problem.

SUMMARY OF THE INVENTION

A capacitor structure and method of forming the capacitor structure are disclosed herein. The capacitor comprises a HDC dielectric and upper and lower electrodes. The lower electrode comprises a diffusion barrier and an oxygen stable material. The diffusion barrier is formed over a structure and then a temporary dielectric layer is formed over the diffusion barrier. The temporary dielectric layer is then patterned and etched to expose the area where the storage node is desired. Next, the oxygen stable material is formed over the temporary dielectric layer and in the storage node area. The oxygen stable material is then either etched back or CMP processed using the temporary dielectric layer as an endpoint. The temporary dielectric layer is then removed. The HDC dielectric is then formed adjacent the oxygen stable material.

An advantage of the invention is proving a method of forming a high-K capacitor that does not require a fine patterned etch of the oxygen stable material for the lower electrode.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention is described herein in conjunction with a high-K capacitor structure for a DRAM application. It will be apparent to those of ordinary skill in the art that the benefits of the invention are also applicable to other high-K capacitor structures.

Figure 1:
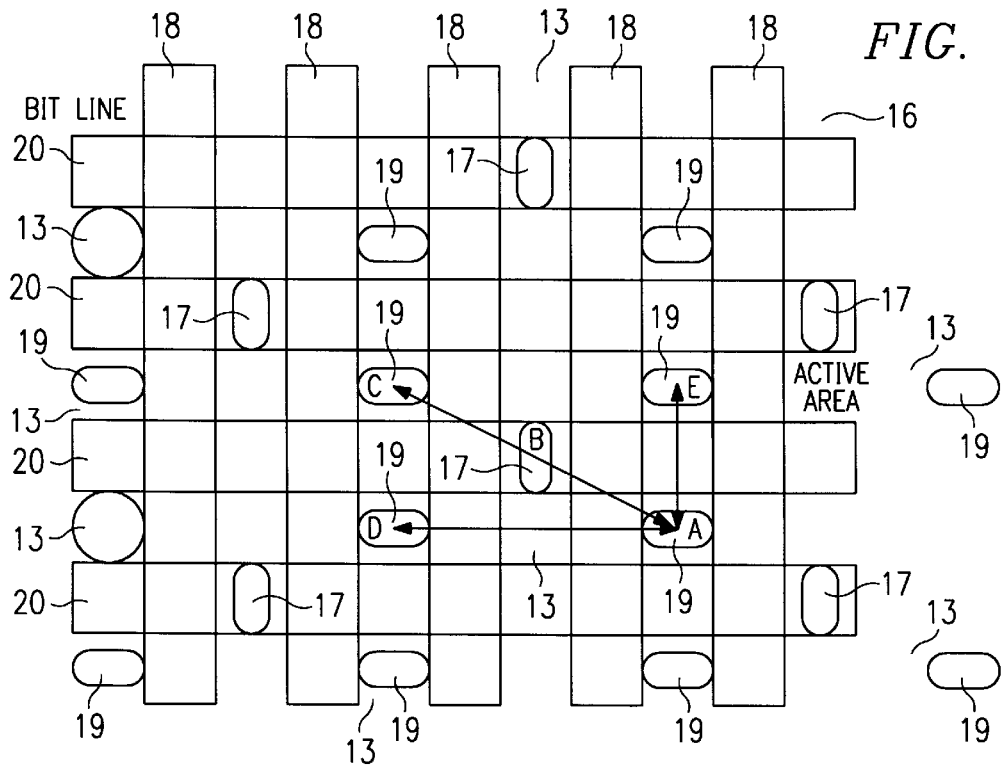
FIG. 1 is a top view of a DRAM array.

FIG. 1 is a top view of a DRAM array 10. DRAM array 10 consists of a plurality of wordlines 18 (shown as running vertically) and a plurality of bitlines 20 (shown as running horizontally). The active areas 13 are isolated from each other by isolation structures 16. Isolation structures 16 are shown in FIG. 1 as the unshaded areas including the unshaded areas running below the bitlines 20 and wordlines 18. Contact/vias 17 and 19 extend down to the active area 13. Contact/vias 17 are bitline contacts that connect the active area to the bitlines 20 and contact/vias 19 are polysilicon plugs that connect the active areas 13 to the storage node contact for the capacitor (not shown).

Figure 2:
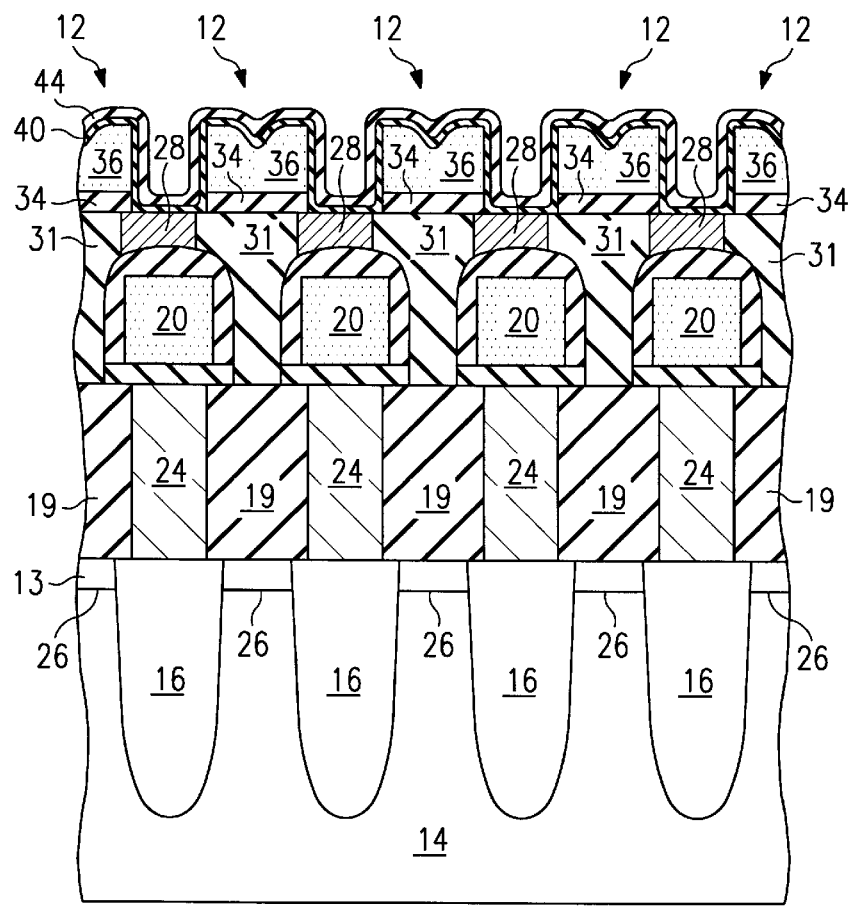
FIG. 2 is a cross-sectional diagram of a DRAM array including a capacitor according to the invention.

A cross-section of DRAM array 10 through a line through A and E of FIG. 1 is shown in FIG. 2. The DRAM array 10 is located on substrate 14. Substrate 14 is typically silicon. However, other semiconductors such as germanium or diamond, compound semiconductors such as GaAs, InP, Si/Ge, or SiC, and ceramics may alternatively be used. Insulating regions 16 are used to isolate the pair of DRAM cells 10 from other DRAM cell pairs (not shown). As shown, insulating regions 16 comprise trench isolation. Other isolation structures known in the art, such as LOCOS isolation, may alternatively be used. Wordline structures 18 are not shown in this cross-section and may the same as those used conventionally in DRAM structures. Bitlines 20 extend into the page and are separated from substrate 14 by a first interlevel dielectric layer 24. Bitline contacts 17, that connect bitlines 20 to the active areas 13 are not shown. The source/drain regions 26 of active area 13 are each connected to polysilicon plugs 19. The interlevel dielectric layers 24 and 28 typically comprise an oxide such as silicon dioxide. The above described elements are conventionally found in DRAM arrays.

The bottom electrode of capacitors 12 comprises a plug 19 that extends from source/drain region 26 through interlevel dielectric layer 24 and a storage node contact (SNCT) 31 that extends from plug 19 through interlevel dielectric 28. Plug 19 and SNCT 31 would typically comprise doped polysilicon, such as insitu-doped polysilicon. Above SNCT 31, a diffusion barrier layer 34 is located. The thickness of diffusion barrier layer 34 may be on the order of 1000 A. Above diffusion barrier layer 34 is oxygen stable layer 36. The height of oxygen stable layer 36 is the height desired for the storage node. For a 1 Gbit BST DRAM, a store thickness of approximately 3000 A is appropriate. Diffusion barrier 34 preferably comprises titanium-aluminum-nitride. Other materials that prevent the diffusion of oxide and that do not react with the SNCT 31, such as titanium-nitride, ternary (or greater) amorphous nitrides (e.g., Ti—Si—N, Ta—Si—N, Ta—B—N, or Ti—B—N), or other exotic conductive nitrides (e.g., Zr nitride, Hf nitride, Y nitride, Sc nitride, La nitride and other rare earth nitrides, nitride deficient Al nitride, doped Al nitride, Mg nitride, Ca nitride, Sr nitride and Ba nitride) may alternatively be used. Oxygen stable layer 36 preferably comprises platinum. Other possible materials include other noble metals or alloys thereof (e.g., palladium, iridium, ruthenium, rhodium, gold, silver), conductive metal compounds (e.g., binary oxides, RuOx, tin oxide, IrOx, indium oxide, etc,), or conductive perovskite like materials (e.g., (La,Sr)CoO3+, SrRuO3, etc.).

Diffusion barrier 34 prevents oxygen from diffusing through oxygen stable layer 36 and reacting with/oxidizing SNCT 31. It also prevents oxygen stable layer 36 from reacting with SNCT 31 to form a silicide.

The capacitor dielectric 40 is a high dielectric constant dielectric, typically having a dielectric constant greater than 50. Barium-strontium titanate (BST) is a typical example. Other examples include SrTiO3, BaTiO3, ferroelectric materials such as Pb(Zr,Ti)O3, (Pb,La)(Zr,Ti)O3, Nb doped PZT, doped PZT, Bi4Ti3O12, SrBi2(Ta,Nb)2O9, and other layered perovskites, relaxors such as lead-magnesium-niobate. Dielectric 40 follows the contour of the device and is located on the sidewalls and on the surface of oxygen stable layer 36. The formation of dielectric 40 is typically performed in an O2 ambient. Oxygen stable layer 36 is stable in O2 and since only the oxygen stable layer and diffusion barrier portions of the bottom electrode is exposed during BST formation, oxidation of the bottom electrode is prevented. A top electrode 44 is located over the dielectric 40. The top electrode 44 comprises conventional materials.

Figure 3A:
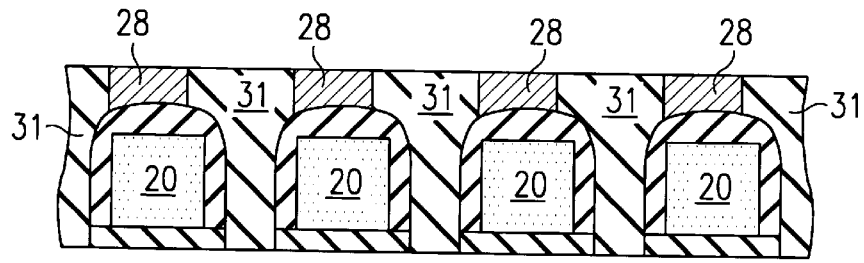
FIGS. 3A–3F are cross-sectional diagrams of the DRAM array of FIGS. 1 and 2 at various stages of fabrication.

A method for forming the DRAM array 10 of FIGS. 1 and 2 will now be described in conjunction with FIGS. 3A–3F, 4, and 5A–5B. The structure is processed through the formation of interlevel dielectric 28 as shown in FIG. 3A. FIG. 3A only shows the portion of the structure from the bitlines 20 and up. Isolating regions 16, source/drain regions 26, wordline structures 18, bitlines 20, SNCT 31 and interlevel dielectrics 24 and 28 (all shown in FIG. 2) have already been formed. Conventional techniques known in the art may be used to formed these structures.

Figure 3B:
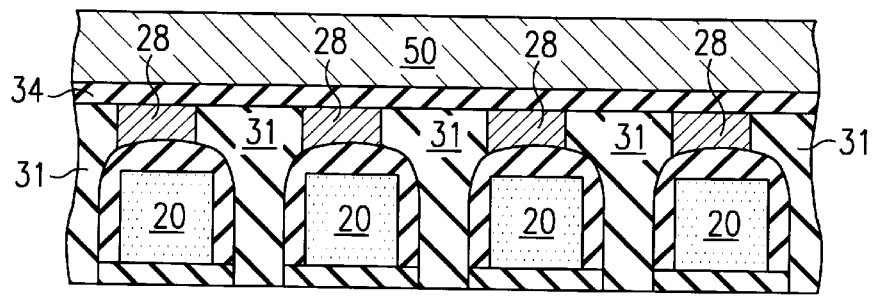

Referring to FIG. 3B, the diffusion barrier 34 is formed over the structure. Although titanium-nitride is a popular diffusion barrier, a material such as Ti—Al—N is preferable because of its superior oxidation resistance. Optimum Ti—Al—N compositions are $T_{1-x}Al_xN$, where $0.3<x<0.5$. Other materials that may be used for diffusion barrier 34 include, but are not limited to, ternary (or greater) amorphous nitrides and exotic conductive nitrides as listed in more detail above. In forming diffusion barrier 34, CVD or sputter deposition, for example, may be used. The thickness of diffusion barrier 34 may be in the range of 100–500 A.

Figure 3C:
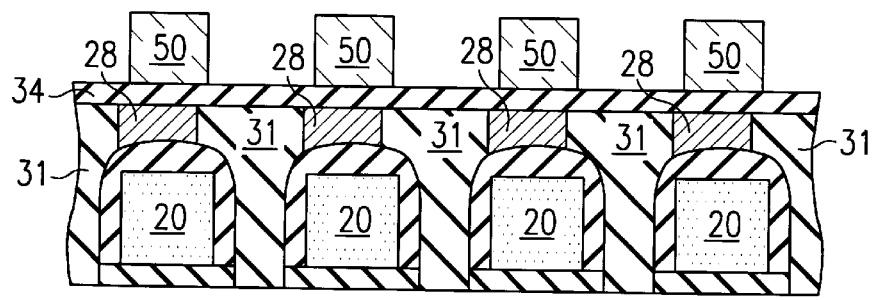

Next, a temporary dielectric layer 50 is deposited over diffusion barrier 34. Examples for temporary dielectric layer 50 included PSG and TEOS. Other examples will be apparent to those of ordinary skill in the art having reference to the specification. The composition of temporary layer 50 and diffusion barrier 34 should be chosen such that temporary dielectric layer 50 may be removed selectively with respect to diffusion barrier 34. The thickness of layer 50 is on the order of the desired thickness of the storage node. For a 1 Gbit BST DRAM this is expected to be on the order of 3000 A. A store hole pattern is then placed on temporary layer 50. The store hole pattern exposes temporary layer 50 where the storage node is desired. This pattern can be slightly larger than minimum CD in order to improve the alignment to SNCT 31. Using this pattern, a very anisotropic etch is used to etch the temporary dielectric layer 50 down to diffusion barrier 34, as shown in FIG. 3C. The pattern is then removed.

Figure 3D:
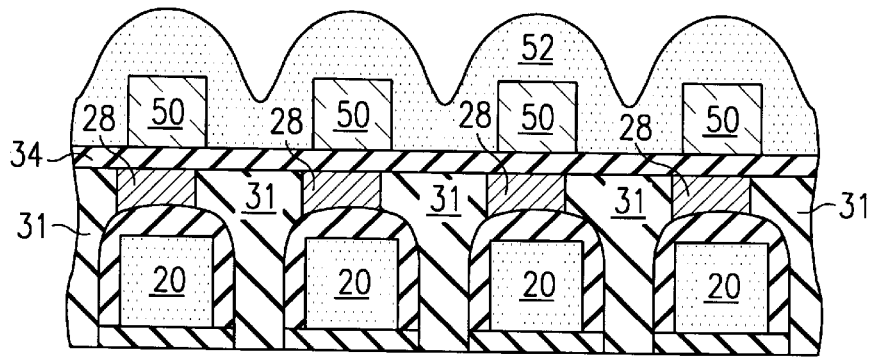
Figure 4:
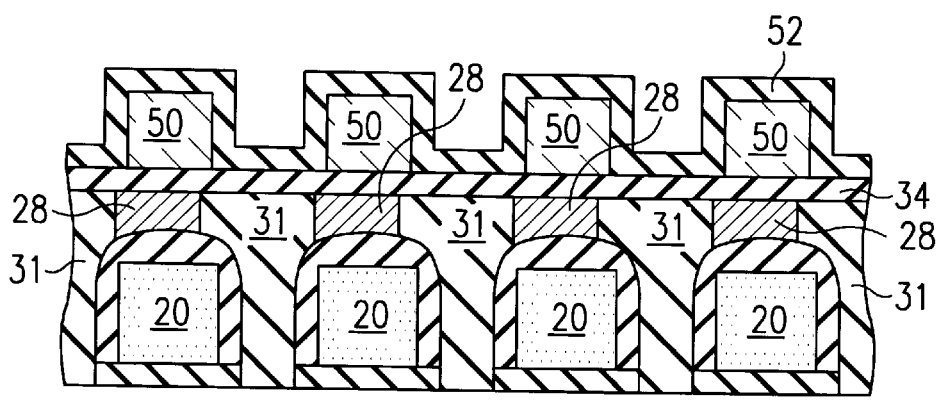
FIG. 4 is a cross-sectional diagram of a DRAM array including a crown-type capacitor according to an embodiment of the invention.

Referring to FIG. 3D, an oxygen stable material 52 is deposited over the structure. Pt is an excellent oxygen stable material for material 52. Other examples for an oxygen stable material 52 include other noble metals and conductive oxides such as RuO2+, IrOx, PdO, (LaSr)CoO3+ and SrRuO3. A thick oxygen stable material 52 for forming plug structure is shown in FIG. 3D. For the plug structure, sputter deposition to a thickness on the order of the 3000 A may be used. Alternatively, a thin conformal layer may be deposited to form a pseudo-crown structure as shown in FIG. 4. Other structures will be apparent to those of ordinary skill in the art. Depositing a conformal layer has the advantage of using less material. If, for example, Pt is used as the oxygen stable material 52, the cost of the material is a significant fraction of the cost of the process. In fact, if a thick Pt layer is used, the cost of the material may exceed the cost of performing the process step. A CVD would be preferred for the structure shown in FIG. 4, but a sputter process with at least ~50% step coverage could be successfully integrated into the process flow. Other processes such as reflow or forcefill may alternatively be used.

Figure 3E:
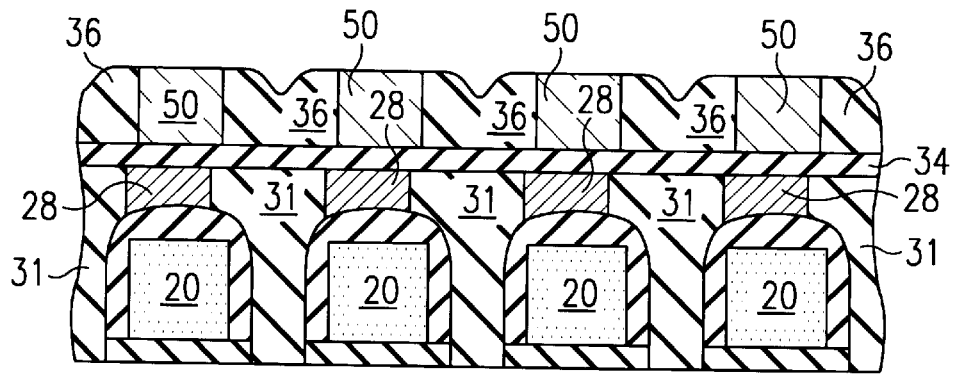

Referring to FIG. 3E, oxygen stable material 52 is then planarized with the surface of temporary layer 50 to form storage node 36. There are two approaches for planarizing the oxygen stable material 52. The first approach is to use chemical-mechanical planarization (CMP). For the case where storage node 36 comprises Pt, CMP may be difficult because Pt is so chemically inert. Chemically etching Pt typically requires hydrochloric acid plus either nitric acid or hydrogen peroxide. One slightly less corrosive solution that might be easier to use (although less chemically effective) would be a Cl salt like ammonium chloride plus hydrogen peroxide. Alternatively, a soft particle may be used to enhance CMP. Pt is much softer than silicon dioxide and a soft particle will grind Pt faster than it will silicon dioxide.

Figure 5A:
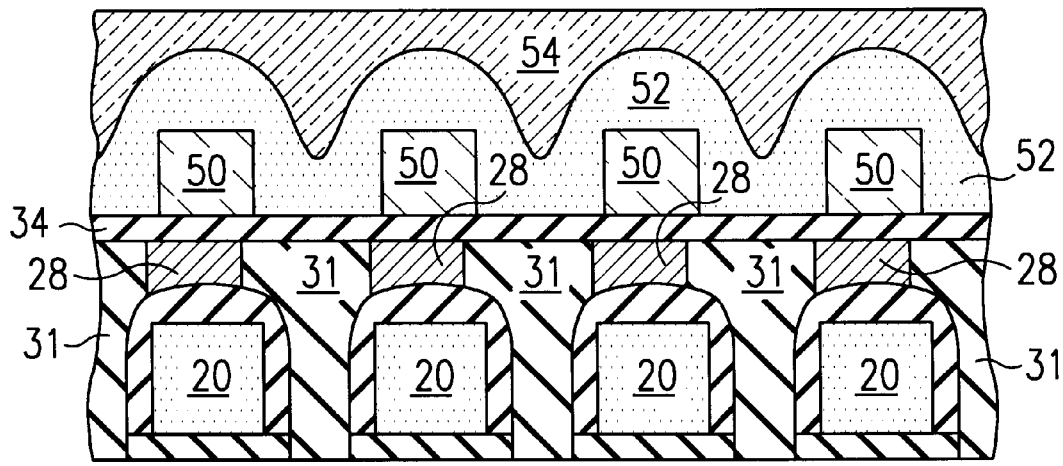
FIGS. 5A–5B are cross-section diagrams of a DRAM array at various stages of fabrication using spin-on glass planarization according to an embodiment of the invention.
Figure 5B:
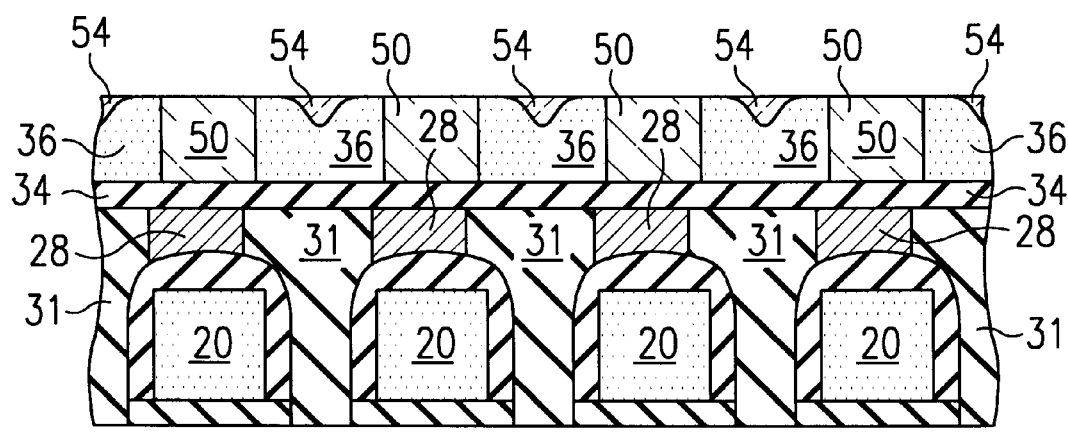

The second method to planarize the oxygen stable material 52 is by etchback. If the oxygen stable material 52 has not been deposited so thick as to form a relatively flat surface, a spin-on glass layer 54 may be deposited to perform a local planarization, as shown in FIG. 5A. If material 52 forms a relatively flat surface, then spin-on glass layer 54 is not needed. Next, the SOG layer 54 and oxygen stable material 52 are etched back using, for example, a dry etch with very similar etch rates for the two materials, resulting in storage node 36 as shown in FIG. 5B. The etch rate of Pt in Ar is much slower that oxide but the etch rate in pure O2 is higher than oxide. Therefore, the Ar/O2 ratio can be adjusted to achieve the same etch rate. Other possible chemistries, such as Cl2 /O2, will be apparent to those of ordinary skill in the art.

Optionally, at this point, it may be advantageous to improve the microstructure or surface morphology of storage node 36 by reflow, grain growth, or both. If the storage node 36 comprises a noble metal, then surface and grain boundary mobility are large enough for reflow and grain growth. There is a driving force to reduce the surface energy or surface area of Pt. This is most easily done by filling the holes. Grain boundaries are disadvantageous because the grain boundaries act as fast diffusion paths for oxygen (present during the subsequent capacitor dielectric formation) from the ambient to the diffusion barrier 34 and for impurities such as Ti from the diffusion barrier 34 to the top of the oxygen stable layer 36. Since a capacitor structure for a 1 Gbit DRAM is only on the order of 0.18 $\mu$m wide and the grain size of Pt can be on the order of 0.3 $\mu$m wide, single grain capacitors are possible. Grain growth can be achieved by annealing the structure, thereby resulting in most if not all of the capacitors achieving a single grain per capacitor. Grain boundary motion and surface diffusion are significantly influenced by oxygen with reducing or lack of oxygen resulting in much faster surface diffusion.

Figure 3F:
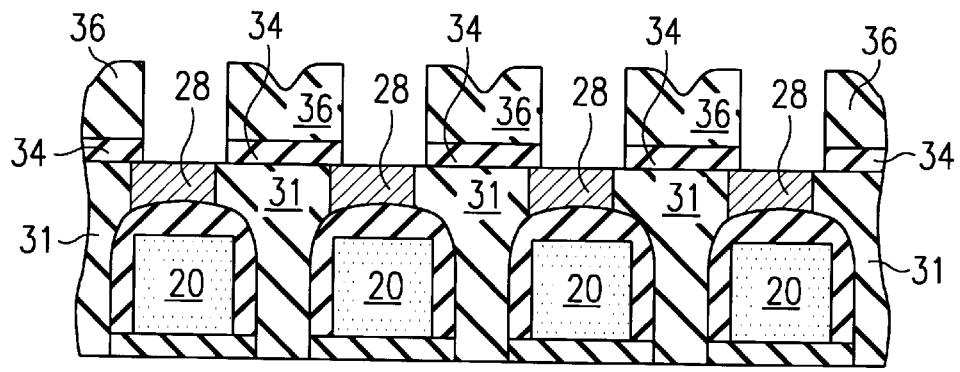

Next, temporary layer 50 (and the remains of SOG layer 54 if present) are removed using storage node 36 as a mask, as shown in FIG. 3F. For example, a wet, selective dry or vapor dielectric etch may be used. The remaining storage node 36 can have 90° sidewalls. The top of the storage node 36 may not be planar. However, the majority of the storage area comes from the storage node 36 sidewalls. A second etch is then used to remove the exposed portions of diffusion barrier 34.

The invention has several benefits. One benefit is that the oxygen stable storage node 36 is defined by etching the easily etchable material of the temporary dielectric 50 (e.g. PSG) and not by fine pattern etching the oxygen stable material 52. With the exception of Ru, most of the oxygen stable bottom electrode materials are very hard to dry etch fine patterns. The principle problem is the difficulty in forming volatile halides or oxides. For example, etching Pt in fluorine and chlorine gas mixtures is almost a completely physical process until very high temperatures (>300° C.) are reached. Physical etching typically results in redeposition on the sidewalls of photoresist or other pattern definers unless a very sloped sidewall (<G5 degrees) is used. If the goal is to etch 1G-like structures (F-0.18 $\mu$m) with reasonable aspect ratios (>1), then sloped sidewalls are a serious problem.

The structure of FIG. 3F is the storage node 36 upon which the HDC capacitor dielectric 40 is deposited (see FIG. 1). The preferred HDC dielectric is BST. However, other HDC dielectric could alternatively be used. Finally, the top capacitor electrode 44 is formed over HDC dielectric 40. Exemplary top electrode materials for use over a HDC dielectric are known in the art. The top electrode 44 will, in general, comprises the same material(s) as the bottom electrode in order to have symmetrical leakage currents. The material in contact with the capacitor dielectric 40 can be relatively thin if it is covered by a conductive diffusion barrier or other metallization layer. A specific embodiment might comprises a 50 nm thick Pt or Ir layer. The deposition is either sputter deposited (long throw, collimated, or ionized for better conformality) or CVD. Next, a 50–100 nm thick layer of TiN or TiAlN is deposited by reactive sputter deposition or by CVD. The top electrode 44 is then pattern by reactive ion etch process and TiN or TiAlN can be used as a hardmask for the remaining etch if desired. The sample might be annealed in $N_2$ is TiN is used of $O_2$ is TiAlN is used as a hardmask. Typical anneal conditions are 650° C. in $N_2$ or $O_2$ for 30 sec for 550° C. in $N_2$ or $O_2$ for 30 min.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a high dielectric constant (HDC) capacitor comprising the steps of:

forming a diffusion barrier layer over a structure for which the capacitor is desired;

forming a temporary dielectric layer over said diffusion barrier;

forming a pattern over the temporary dielectric layer, said pattern exposing portions of the temporary dielectric layer for a storage node area;

etching said temporary dielectric layer using said pattern to remove said temporary dielectric layer in said storage node area, thereby exposing a first portion of said diffusion barrier;

removing said pattern;

depositing an oxygen stable material over said temporary dielectric layer and said first portion of said diffusion barrier;

removing said oxygen stable material from over said temporary dielectric layer, leaving said oxygen stable material in said storage node area;

removing said temporary dielectric layer thereby exposing a second portion of said diffusion barrier;

removing said second portion of said diffusion barrier;

forming a HDC dielectric over the oxygen stable material; and forming an upper electrode over the HDC dielectric.

2. The method of claim 1, wherein the step of removing the oxygen stable material comprises the steps of:

reactive ion etching said oxygen stable material to etchback said oxygen stable material to a level at or below a surface of said temporary dielectric layer.

3. The method of claim 1, wherein the step of removing the oxygen stable material comprises the steps of:

chemically-mechanically polishing said oxygen stable material until oxygen stable material is at a level at or below a surface of said temporary dielectric layer.

4. The method of claim 1, wherein the oxygen stable layer comprises a material selected from the group consisting of noble metals, alloys of noble metals, and conductive oxides.

5. The method of claim 1, wherein said HDC dielectric comprises a material selected from the group consisting of BST, other perovskites, ferroelectrics, pyroelectrics, or high dielectric constant oxides.

6. The method of claim 1, wherein said temporary dielectric comprises silicon dioxide.

7. The method of claim 1, further comprising the step of forming a spin-on-glass layer over the oxygen stable material for local planarization prior to said step of removing said oxygen stable material from said temporary dielectric layer.

8. The method of claim 1, further comprising the step of:

annealing the oxygen stable material after said step of removing the oxygen stable material from the temporary dielectric and prior to the step of removing the temporary dielectric in order to grow the grain size of the oxygen stable material.

9. The method of claim 1, further comprising the step of reflowing the oxygen stable material after said step of removing the oxygen stable material from the temporary dielectric and prior to the step of removing the temporary dielectric in order to reduce the surface area of the oxygen stable material.

10. A method for forming a DRAM comprising the steps of:

providing a semiconductor body processed through interlevel dielectric formation, including the formation of isolation structures, wordlines, and bitlines;

forming a diffusion barrier layer over said interlevel dielectric;

forming a temporary dielectric layer over said diffusion barrier layer;

forming a first pattern over said temporary dielectric layer, said first pattern exposing an storage node area;

etching said temporary dielectric layer using said first pattern;

removing said first pattern;

depositing an oxygen stable material over said temporary dielectric and in said storage node area;

removing said oxygen stable material until said temporary dielectric is exposed;

removing said temporary dielectric layer, thereby exposing a portion of said diffusion barrier;

removing said portion of said diffusion barrier;

forming a HDC dielectric over the oxygen stable layer; and forming an upper electrode over the HDC dielectric.

11. The method of claim 10, wherein the step of providing a semiconductor body comprises the steps of:

forming isolation structures in a semiconductor body to isolate a plurality of DRAM cell pairs from one another;

forming a plurality of wordline structures over said semiconductor body;

forming a plurality of first and a plurality second source/drain regions on opposite sides of said plurality of wordline structures;

forming a dielectric over said wordlines, isolation structures and first and second source/drain regions;

forming a plurality of bitlines connected to said plurality of first source/drain regions;

forming an interlevel dielectric over said plurality of bitlines; and forming a plurality of storage node contacts extending through said interlevel dielectric layer, wherein said pattern is aligned to said plurality of storage node contacts.

12. The method of claim 10, wherein the step of removing the oxygen stable layer comprises the step of reactively ion etching said oxygen stable layer.

13. The method of claim 10, wherein the step of removing the oxygen stable layer comprises the step of chemically-mechanically etching said oxygen stable layer.

14. The method of claim 10, wherein said diffusion barrier comprises a material selected from the group consisting of titanium-nitride, ternary or greater amorphous nitrides, and exotic compound nitrides.

15. The method of claim 10, wherein the oxygen stable layer comprises a material selected from the group consisting of noble metals, alloys of noble metals, and conductive oxides.

16. The method of claim 10, wherein said HDC dielectric comprises a material selected from the group consisting of BST, other perovskites, ferroelectrics, pyroelectrics, or high dielectric constant oxides.

17. The method of claim 11, wherein said pattern exposes portions of said temporary dielectric layer wider than said storage node contact.

* * * * *